(12) United States Patent
Schamber et al.

(10) Patent No.: US 8,334,511 B2
(45) Date of Patent: Dec. 18, 2012

(54) ELECTRON MICROSCOPE WITH INTEGRATED DETECTOR(S)

(75) Inventors: Frederick H. Schamber, Murrysville, PA (US); Cornelis G. Van Beek, Pittsburgh, PA (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 12/735,499

(22) PCT Filed: May 14, 2010

(86) PCT No.: PCT/US2010/001438
§ 371 (c)(1),
(2), (4) Date: Apr. 28, 2011

(87) PCT Pub. No.: WO2010/132124
PCT Pub. Date: Nov. 18, 2010

(65) Prior Publication Data
US 2011/0204229 A1    Aug. 25, 2011

Related U.S. Application Data

(60) Provisional application No. 61/216,290, filed on May 15, 2009.

(51) Int. Cl.
*G01N 23/00* (2006.01)
(52) U.S. Cl. ......... 250/311; 250/306; 250/307; 250/310
(58) Field of Classification Search ........................ None
See application file for complete search history.

(56) References Cited

U.S. PATENT DOCUMENTS

| | | | | |
|---|---|---|---|---|
| 4,317,036 A | * | 2/1982 | Wang | 378/45 |
| 4,519,092 A | * | 5/1985 | Albert | 378/45 |
| 5,450,463 A | * | 9/1995 | Iketaki | 378/43 |
| 5,481,109 A | * | 1/1996 | Ninomiya et al. | 250/310 |
| 5,517,033 A | * | 5/1996 | Krivanek et al. | 250/397 |
| 5,590,168 A | * | 12/1996 | Iketaki | 378/43 |
| 5,594,246 A | * | 1/1997 | Sudo et al. | 250/310 |
| 5,755,877 A | * | 5/1998 | Kamakura et al. | 117/85 |
| 5,816,052 A | * | 10/1998 | Foote et al. | 62/51.1 |

(Continued)

OTHER PUBLICATIONS

Zaluzec, Nestor J., Innovative Instrumentation for Analysis of Nanoparticles: The π Steradian Detector, Microscopy Today, Jul. 2009, pp. 56-59, Cambridge University Press, New York, NY, USA.

(Continued)

*Primary Examiner* — David A Vanore
*Assistant Examiner* — Andrew Smyth
(74) *Attorney, Agent, or Firm* — Scheinberg & Griner, LLP; Michael O. Scheinberg; John B. Kelly

(57) ABSTRACT

An electron microscope including a vacuum chamber for containing a specimen to be analyzed, an optics column, including an electron source and a final probe forming lens, for focusing electrons emitted from the electron source, a specimen stage positioned in the vacuum chamber under the probe forming lens for holding the specimen, and an x-ray detector positioned within the vacuum chamber. The x-ray detector includes an x-ray sensitive solid-state sensor and a mechanical support system for supporting and positioning the detector, including the sensor, within the vacuum chamber. The entirety of the mechanical support system is contained within the vacuum chamber. Multiple detectors of different types may be supported within the vacuum chamber on the mechanical support system. The mechanical support system may also include at least one thermoelectric cooler element for thermo-electrically cooling the x-ray sensors.

26 Claims, 10 Drawing Sheets

U.S. PATENT DOCUMENTS

| | | | |
|---|---|---|---|
| 5,877,498 A * | 3/1999 | Sugimoto et al. | 250/310 |
| 6,396,061 B1 | 5/2002 | Madden et al. | |
| 6,421,415 B1 * | 7/2002 | Peczkis et al. | 378/46 |
| 6,452,177 B1 * | 9/2002 | Feldman et al. | 850/9 |
| 6,590,210 B1 * | 7/2003 | Essers | 850/9 |
| 6,797,953 B2 * | 9/2004 | Gerlach et al. | 850/16 |
| 7,335,895 B1 * | 2/2008 | Spallas et al. | 250/396 R |
| 7,339,175 B1 | 3/2008 | Drummond et al. | |
| 7,378,664 B1 * | 5/2008 | Howard et al. | 250/370.15 |
| 7,906,762 B2 * | 3/2011 | Bierhoff et al. | 250/310 |
| 7,910,888 B2 * | 3/2011 | Tanaka et al. | 250/336.2 |
| 8,093,558 B2 * | 1/2012 | Buijsse | 250/311 |
| 2006/0138325 A1 | 6/2006 | Choi | |
| 2006/0169901 A1 | 8/2006 | Nguyen-Huu et al. | |
| 2006/0226340 A1 * | 10/2006 | Sasayama et al. | 250/208.1 |
| 2007/0057182 A1 | 3/2007 | Feuerbaum | |
| 2007/0145266 A1 | 6/2007 | Cohen et al. | |
| 2007/0153980 A1 | 7/2007 | Butzine et al. | |
| 2008/0121801 A1 * | 5/2008 | Howard et al. | 250/307 |
| 2008/0156996 A1 * | 7/2008 | Nicolosi et al. | 250/370.15 |
| 2008/0191598 A1 * | 8/2008 | Yang et al. | 313/310 |
| 2008/0308742 A1 | 12/2008 | Gerlach et al. | |
| 2010/0148064 A1 | 6/2010 | Harrach et al. | |
| 2010/0171037 A1 * | 7/2010 | Bierhoff et al. | 250/310 |
| 2010/0230590 A1 * | 9/2010 | Bierhoff et al. | 250/310 |
| 2010/0303206 A1 * | 12/2010 | O'Dwyer et al. | 378/83 |

OTHER PUBLICATIONS

Von Harrach, H.S. et al., An Integrated Multiple Silicon Drift Detector System for Transmission Electron Microscopes, 4 pages, published on the Website of FEI Company of Eindhoven, The Netherlands in 2009, www.FEI.com.

* cited by examiner

ELECTRON MICROSCOPE WITH INTEGRATED DETECTOR(S)

CROSS REFERENCE

This application depends upon U.S. Provisional Application No. 61/216,290, filed 15 May 2009, entitled ELECTRON MICROSCOPE WITH INTEGRATED DETECTOR (S), the entirety of which is incorporated herein by reference.

BACKGROUND OF THE INVENTION

The invention pertains to the integration of semiconductor x-ray radiation sensors within a Scanning Electron Microscope (SEM) or similar analytical electron-beam instrument, optionally in conjunction with a backscattered electron sensor. The invention pertains to novel methods of configuring both the detection elements and the microscope so as to achieve improvements in performance and economies of construction, as well as other benefits.

The installation of a solid-state Energy Dispersive X-ray (EDX) detector onto an electron microscope was first reported by Fitzgerald, Keil, and Heinrich in 1968. The type of detector described was a lithium-drifted silicon (Si(Li)) diode that was introduced through the port of an electron probe micro analyzer (EPMA). This kind of detector was soon commercialized and units of this same general type have been installed on many kinds of Electron Microscope (EM), notably including the Electron Probe Micro-Analyzer (EPMA), Scanning Electron Microscope (SEM), Transmission Electron Microscope (TEM), and Scanning Transmission Electron Microscope (STEM). Though the technology has been greatly refined over the years, the EDX units themselves have retained certain significant characteristics of the earliest models.

FIG. 1 is a schematic representation of a conventional Si(Li) EDX detector unit [60]. The active sensor element [1] is the Si(Li) diode and installed in close proximity is the sensor's field effect transistor (FET) [2] which amplifies the current pulse produced by the sensor element. Both the sensor element and the FET are mounted on the anterior end of a thermally conductive rod [3] that is in thermal contact at its posterior end with a reservoir of liquid nitrogen [4] contained in an insulated container called a dewar. The thermally conductive rod ("cold finger"), the sensor diode, and the FET are all enclosed in a tubular hermetic envelope [5] that is maintained at a high vacuum, both to minimize thermal transfer, and to maintain the sensor in a clean condition. The anterior end of the tubular hermetic envelope is closed with a thin window [6] that admits x-rays to the front face of the sensor but maintains the interior vacuum. The liquid nitrogen (LN) reservoir [4] is an essential aspect of the design of the conventional Si(Li) detector since it is required that the sensor element and FET be maintained at a cryogenic temperature if acceptable energy resolution is to be achieved. A collection of circuitry conventionally known as a "preamplifier" [61] receives and further amplifies the signal received from the sensor FET [2] as well as providing additional electronic functions in support of the sensor operation. In order to implement a complete EDX system, the detector unit of FIG. 1 would be supplemented with additional electronic components. Such components conventionally provide for necessary electrical power, digitization of the waveform received from the preamplifier [61], collection and display of the resulting x-ray spectrum, and spectrum analysis functions. Such additional support components are known in the art and are not the focus of the present invention.

FIG. 2 schematically illustrates the manner in which a conventional Si(Li) EDX detector unit [60] is installed on a conventional SEM or EPMA (which are physically similar instruments). The EDX detector unit is mounted on a flange [7] that is bolted onto one of the several ports usually provided for such use on the specimen chamber [8] of the electron microscope. The sensor end of the EDX detector [60] is thus brought into close proximity to the specimen [9] (positioned on specimen stage [9']), to intercept the x-rays emitted at the point of impact of the focused electron beam [10]. The electron beam is produced by the electron optics "column" [11]. A backscattered electron (BSE) detector [62] is commonly mounted beneath the final focusing lens [11'] of the electron column [11]. The specimen chamber [8] is shown with one side open for purposes of this illustration, but in use, the specimen chamber must be sealed and evacuated (and is thus interchangeably known as the "vacuum chamber"). Thus, the detector tube [5] of the detector unit [60] must be vacuum-sealed at the flange [7] where it passes through the vacuum chamber wall. Customarily this involves a radial o-ring seal to the exterior of the tube, and typically this is designed as a sliding seal so that the insertion of the detector relative to the specimen may be varied. Thus the cylindrical tube [5], the flange [7], and the "cold finger" [3] function in a complementary fashion to support the sensor element [1] in its desired relation to the specimen. This support system may be configured in a variety of ways, but it is physically anchored by the flange [7] which is mounted to the exterior of the vacuum chamber [8].

The above figures and explanations describe, in a very general manner, the standard design of the Si(Li) EDX detector and the manner in which it is installed on an electron microscope of the SEM/EPMA type wherein the specimen stage [9'] carrying a bulk specimen [9] is located beneath the final probe-forming lens [11'] which constitutes the bottom element of the electron optics column [11]. Si(Li) detectors of similar design have also been employed with electron microscopes of the STEM/TEM type wherein a small electron-transmissive specimen is supported in the gap of an objective lens. Though certain specialized considerations may pertain to EDX detectors employed for STEM/TEM types of instrument, those detectors too have also generally conformed in the historical practice to the principles of construction illustrated in FIG. 1.

Pertaining to the interface of an EDX detector to an electron microscope of the SEM/EPMA type (which is the field of the subject invention), there are several important considerations affecting the performance of the detector:

(a) A large detection solid angle is desirable in order to maximize the number of detected x-rays (and thus the statistical precision) that can be achieved for a given beam current and measurement time.

(b) A high take-off angle is desirable in order to minimize absorption effects as the excited x-rays exit from a point of origin below the surface of the specimen.

(c) Optimal collimation of the detected x-rays is facilitated by pointing the detector coaxially at the intended beam impact point on the specimen. Such collimation ensures that only the uniformly responsive area of the sensor is employed for detection and that x-rays originating from scattered electrons are excluded.

Thus, in an "ideal" situation, the sensor element would be located very close to the specimen, with its axis in line with the intended beam impact point, and inclined at a high take-off angle. However, it is also desirable for the focusing lens of the microscope to be in close proximity to the specimen and, for the many applications in which a backscattered electron detector is required, that the BSE detector's view of the specimen should not be obscured. Thus, the space under the focusing lens is both small and crowded and this restricts the attainment of ideal detector geometry. Further, the physical arrangement of the specimen chamber, such as the presence of access doors and auxiliary ports, will play a large role in restricting where and how detectors may be placed.

It can be appreciated that the above considerations, when coupled with the over-riding necessity of thermally coupling the Si(Li) sensor to an external cryogenic cooler, have shaped the evolution of the traditional EDX detector unit into the familiar tube-mounted configuration illustrated in FIG. 1 (which has sometimes been descriptively referred to as a "sensor on a stick"). In turn, the standardization on this kind of tube-mounted configuration has also affected the design of electron microscopes which, by necessity, are specifically configured for mounting of such detectors. Since x-ray detectors have historically been designed and manufactured by one group of suppliers and electron microscopes by another, departure from this familiar model has not been attractive to either group.

Within the past decade, the technology of EDX detectors has been radically altered by the introduction of highly capable x-ray sensors that do not require cryogenic cooling. The principal current embodiment of this type of detector is the so-called "silicon drift detector" (SDD) whose operation is described in the scientific literature. These devices achieve spectroscopic performance generally superior to that of the Si(Li) detector, but at temperatures that can be conveniently achieved with a small thermoelectric cooler (TEC) based on the Peltier principle.

FIG. 3 illustrates the basic structure of a packaged SDD module as may currently be purchased from a manufacturer (PNDetector GmbH of Munich, Germany) of such devices. Within such a module, the SDD sensor element [12] is a small planar "chip" manufactured by semiconductor processes. The SDD sensor chip is mounted on the cold face of a small TEC device [13] which is attached to a housing base [14]. A thermally conductive stud [15] is in thermal contact with the warm side of the TEC device and serves as the external "sink" attachment by which heat generated by the TEC is removed from the module. A collimator plate [16] is typically mounted in front of the SDD sensor element [12] so as to permit x-rays to strike only the intended active area. A housing cap [17] is sealed to the housing base [14]. The front of the housing cap [17] is closed with a thin window [18] which permits x-rays to enter and strike the SDD sensor element [12]. The housing base [14] is provided with an array of electrical connection pins [19] through which power and control signals may be provided to the sensor and the TEC, and through which output signals may be extracted (connections of these pins to the internal elements are omitted from the figure). One of the signals available via the output pins is the front-face temperature of the TEC module [13], which permits external circuitry to regulate a constant operating temperature for the sensor element [12] (the temperature sensor required for this regulation is not shown in the figure). The housing base [14] is typically configured according to the "TO-X" convention that has been used within the electronics industry for mounting various types of devices and sensors (e.g., the TO-8 case). The entire module is hermetically sealed and may be evacuated or filled with an inert gas at a reduced pressure.

The FET which amplifies the weak current pulse of the sensor remains a key component of the SDD device and must be located in close proximity to its anode electrode, just as for the Si(Li) technology. However, rather than implementing the FET [2] as a discrete element as illustrated in FIG. 1, one manufacturer of SDD sensors integrates the FET circuitry into the same semiconductor die [12] as the sensor itself, and this is the type of device illustrated in FIG. 3. Other manufacturers mount a discrete FET in close proximity to the anode. Regardless of whether the FET is integrated or discrete, however, it is understood that a FET is associated with the SDD sensor.

The use of the kind of packaged SDD module here illustrated is not required for the implementation of an x-ray detector based on SDD technology. Indeed, it is believed that at least one manufacturer of EDX detector units places the unpackaged elements of the sensor module directly on the end of a cold finger and encloses it in an evacuated tube, thus closely mirroring the conventional construction of the Si(Li) detector illustrated in FIG. 1. There is both specialized art and specialized equipment involved in mounting and packaging the SDD sensor and, to date, the majority of x-ray detector manufacturers have chosen to purchase pre-packaged modules from one of the specialized suppliers of such modules. Thus, for the remainder of this discussion the use of a packaged SDD module, such as illustrated in FIG. 3 will be assumed. However, it will be apparent that the same principles taught in the subject invention could be equally applied to the construction of a detector assembled from unpackaged components.

In order for the packaged SDD module of FIG. 3 to be made into a functional x-ray detector unit, it must be provided with several things:
1) Power supplies and control signals to operate the SDD sensor and its incorporated FET.
2) Preamplifier circuitry to amplify the weak signal from the sensor FET so as to produce a robust waveform that can be quantified.
3) Temperature control electronics that actively regulates the power provided to the internal TEC element [13] so as to maintain the desired operating temperature of the SDD sensor element [12].
4) Mechanical elements to support the module in the required proximity to the specimen.
5) A thermal path to a thermal sink of sufficiently low temperature to which the thermal stud [15] may discharge the heat generated by the module.

To date, commercial SDD detectors have accomplished these provisions in a package that closely emulates the format of the traditional Si(Li) detector. FIG. 4 depicts schematically a conventional SDD detector employing a packaged SDD module. The packaged sensor module [20] is attached to the anterior end of a suitable thermally conductive rod or pipe [21], whose posterior end terminates with a heat dissipating mechanism that is incorporated in the body of the detector which is exterior to the vacuum chamber. A housing tube [71] encloses the thermally conductive rod [21] and provides the sealing surface by which the detector snout maintains a vacuum-tight connection as it passes through the mounting flange attached to a microscope (e.g., flange [7] of FIG. 2). A thermal insulating element [72] provides thermal isolation of the housing tube [71] from the thermally conductive rod [21] while providing mechanical support. The heat dissipating mechanism incorporated in the body of the detector exterior to the vacuum chamber might take various forms (for example, in one known case, a chilled water cooler has been employed). In the specific case illustrated, the thermally conductive rod [21] is terminated with a plate [73] which abuts the "cold" side of a second TEC element [22]. The "warm" side of the second TEC element [22] is in contact with an air-cooled heat sink [23] by which the heat generated by the second TEC element is dissipated to the environment. This heat sink, equipped with fins or similar structures to facilitate convection, is typically integrated into the exterior case of the detector unit. Contained in this case is a collection of electronic circuitry elements [24] which operate the detector and the second TEC element and provide the "preamplifier" function. The above is, of course, a highly generalized illustration of the internal components of a complete SDD detector and is subject to variation in detail, but nonetheless generally conforms to precedents established by the conventional Si(Li) detector:

Firstly, it is apparent that this conventional design adheres to the precedent of the LN-cooled Si(Li) detector, in that the sensor is brought into proximity with the specimen by inserting it into the specimen chamber at the end of a straight tubular element whose form and function is equivalent to that employed by the conventional Si(Li) detector.

Secondly, the thermal circuit of the conventional SDD unit continues to utilize the same "cold finger" strategy employed by the thermal circuit of the Si(Li) detector. Though its role in the SDD is to act as the heat-extraction conduit required by the embedded TEC cooler [13], rather than to directly cool the sensor, as for the Si(Li), in both cases the cold finger provides the thermal connection to an external heat-dissipating sink which is isolated from the specimen chamber.

Finally, like the Si(Li) detector, the conventional SDD detector is a modular unit which positions the sensor by means of a support system, including a tubular enclosure, which is again anchored externally by a flange attached to the vacuum chamber of an electron microscope.

In short, in transitioning from Si(Li) sensor technology to SDD sensor technology, detector manufacturers have effectively retained the conventional detector design with the substitution of: (a) an SDD module for the Si(Li) diode and (b) typically a TEC module and air-cooled heat sink substituted for the LN dewar. This has been a rather logical migration path for both EM manufacturers and EDX detector manufacturers since it retains the conventional format of the Si(Li) detector and this has a number of commercial benefits in terms of compatibility with past and present microscope designs. However, this conventional practice does not take advantage of the opportunities to effect improvements in performance and cost reduction that are created by the altered constraints associated with an x-ray detector that does not require cryogenic cooling.

PRIOR ART

The above background has illustrated the general principles and practices of the conventional EDX detector of both Si(Li) and SDD types, as well as the practices by which such detectors are installed in electron microscopes of conventional design. Prior practice has sought to optimize these principles and practices in various ways which will now be described.

Large Area Detectors

Collection efficiency is one of the most important characteristics of an EDX detector since it dictates the speed and precision of measurements. An obvious strategy for improving collection efficiency is to increase the active area of the sensor, thereby increasing the solid angle. For the Si(Li) detector, this strategy is limited by the direct relationship between detector noise and active area, meaning that resolution rapidly degrades as detector size increases. Consequently, Si(Li) detectors with active areas of greater than 30 $mm^2$ have rarely been used in EM applications. The technology of the SDD detector, on the other hand, largely decouples the detector area from the noise characteristic, so that SDD performance is much less affected by the active area of this type of sensor. Consequently, 80 $mm^2$ SDD detector units are now marketed for electron microscope applications and suitable packaged sensor modules of area up to 100 $mm^2$ are commercially offered. Though such increases in detector size are certainly beneficial in certain respects, they also have drawbacks, and especially within the context of the conventional tubular-mount EDX design. The diameter of the detector tube must accommodate the size of the sensor device with allowance for mounting and connections, and this increased tube diameter limits the optimal placement of the detector. Because of the necessity of avoiding interferences with the final focusing lens, the BSE detector, and the specimen, a larger diameter detector must be somewhat retracted and/or operated at a lower takeoff angle. To avoid these consequences, it would be necessary to increase the working distance of the specimen to the face of the final focusing lens, which is in turn detrimental to the optical performance of the microscope. Thus, it will be appreciated that compromises and diminishing returns ensue when increased detector solid angle is accompanied by an increase in detector tube diameter.

In addition to such geometrical considerations, increasing the detection efficiency by increasing detector area creates other problems when there is a large flux of x-rays impinging on the detector. An SDD detector equipped with modern electronics can detect x-rays at rates upwards of 100,000 events/second. However, at such high rates there is also an increased probability of "summing events" in which two different x-ray emissions reach the detector so close together in time that they cannot be distinguished as separate events. This effect leads to "sum peaks" and other artifacts in the measured x-ray spectrum, and this in turn creates problems relative to accurate analysis. Thus, a large-area detector operated in close proximity to a specimen may be advantageous for analytical circumstances where the x-ray rate is low, but is problematic when the rate is high. Of course, the x-ray detection rate can always be reduced by either reducing the electron beam intensity, thereby reducing the number of x-rays produced, or by withdrawing the detector so as to reduce the solid angle (many detectors are mounted on slides for just this reason). However, exercising either of these strategies tends to defeat the point of a large-area detector, and neither of these strategies is optimal when the specimen has both high-emission and low-emission regions.

Finally, there are other, more subtle issues associated with very-large-area x-ray sensors. One is that the large sensitive area makes it more difficult to collimate the x-ray path to accept x-rays emitted from the point of beam impact and exclude those produced by scattered electrons striking elsewhere. Also, although the energy resolution of SDD detectors does not degrade as significantly as for the Si(Li) detector as the sensor area is increased, there is still some loss of resolution in the current generations of SDD devices. And finally, large-area SDD sensors of spectroscopic quality are substantially more expensive at present than smaller devices.

Thus, the strategy of increasing x-ray detection efficiency by increasing the area of the sensor element is a viable option up to a point, and then other factors increasingly diminish its attractiveness.

Multiple Detectors

An alternative manner of increasing the x-ray detection efficiency has been to employ multiple detectors. This has sometimes been employed with Si(Li) detectors for specialized applications where x-ray collection speed is very important, the microscope is equipped with appropriate mounting ports, and the high cost is warranted. Since this strategy utilizes an independent set of counting electronics for each sensor element, this strategy for multiplying the effective detection solid angle can be accomplished without exacerbating the problem of summing events.

There is also growing recognition that multiple detectors can not only provide greater sensitivity, but can facilitate the analysis of non-flat specimens (such as particulate specimens or fracture surfaces) where topographic effects (such as shadowing) can produce misleading results via a single detector. Further, the elimination of the bulky liquid-nitrogen dewar has made mounting multiple SDD detectors more feasible. For the above reasons, there has been increasing interest within the industry for employing multiple EDX detectors and certain SEM units have been designed with this provision in mind.

Multiple-Element Sensor Arrays

A strategy that can be employed to gain the benefits of multiple detectors without a proliferation of ports on the electron microscope is to incorporate multiple sensor elements in a single detector housing. This is an attractive option for SDD sensors because they are fabricated via semiconductor lithography technology. Thus it is relatively simple to manufacture SDD arrays that incorporate multiple sensor elements in the same die, and such multi-element sensor arrays are commercially available for integration into an x-ray detector unit. A certain commercial detector unit mounts an array of four 10 mm$^2$ sensor elements in a single detector tube, with the array perpendicular to the axis of the tube, and provides each sensor with its own electronics processing channel. In this manner, the single detector provides an equivalent detection solid angle of a 40 mm$^2$ sensor, but can sustain much higher counting rates than a mono-element detector of this size due to the parallel processing electronics. However, because of the intrinsic size of such an array, this kind of detector requires an especially large mounting tube and thus again sacrifices some sensitivity due to setback from the specimen. Thus, this kind of detector is best suited for applications (such as EPMA analysis) where high beam currents are employed, and high count rate is more important than high-sensitivity.

Another commercial variant of the multi-element sensor array concept arranges the sensor elements around a central orifice. When implemented as a detector for electron microscopes, the sensor array is incorporated in a flat housing with a central passage for the beam. The housing is inserted under the final focusing lens of an electron microscope, immediately above the specimen so that the effect is that of four sensors arrayed around the axis of the beam. This arrangement can result in quite favorable detection solid angle and thus provides high sensitivity, as well as the benefits of a symmetric detector array for analyzing rough specimens. However, this sensor occupies the position normally reserved for a BSE detector, and it is thus not suitable for the many applications where a high-quality BSE signal is required. It is also notable that the single current instance of a commercial detector unit of this type attaches the array to the end of a tube that is inserted from a side port in the specimen chamber, and thus propagates a variant of the conventional tubular port-mounted configuration.

It is apparent that the multi-element SDD device can be a very effective means for achieving higher counting rates. Such detectors combine certain of the advantages of both the large area detector and multiple detectors, but they are presently rather costly devices whose special interfacing requirements present challenges for installation in some microscopes. Architecturally, their embodiments for SEM-type instruments have been implemented as straight-forward extensions of conventional modular tube-mount detector geometries.

Entry Window and Electron Trap Considerations

The x-ray window [6] or [18] hermetically seals the detector while permitting the entry of x-rays. Two different basic window types are employed: Beryllium windows are relatively inexpensive and rugged, but are opaque to low-energy x-rays. Consequently, beryllium window (BeW) detectors are not generally useful for measuring elements lower than fluorine in the periodic table. Ultra-thin windows (UTW) are fabricated from a thin material which transmits low-energy x-rays, thus permitting detection of elements as low as beryllium. However, UTW detectors require a magnetic electron trap to prevent energetic scattered electrons from penetrating the x-ray window and striking the sensor, thus corrupting the measured x-ray spectrum. Because the strength of the permanent magnets employed in such a trap is limited by available magnet technology, an increase in the aperture area of such a trap necessarily results in weakened deflection field strength while the amount of required deflection is simultaneously increased. Thus the only recourse is to increase the depth of the trap. Novel constructions notwithstanding, a UTW detector with a large-area sensor must therefore be set back from the specimen further than a smaller-area sensor due to the increased depth of the electron trap. This consideration is applicable for both single element sensors and multi-element sensor arrays and can represent a significant limitation to attainable solid angle when light-element detection is required.

Tilted-Sensor Detectors

The tilted-sensor detector was encountered rather commonly in the early days of EDX technology because electron microscopes of the day had not been designed for installation of high-takeoff-angle detectors. Many of the older SEM instruments had flat-bottomed optics (rather than the truncated-cone style illustrated in FIG. 2) and access ports were located parallel to the bottom of the pole piece. To accommodate such a geometry, the Si(Li) diode element was mounted at an angle within the detector tube such that the tube would protrude horizontally under the pole piece, but the sensor axis would be inclined relative to the specimen. This strategy works reasonably well for small-area detectors, but becomes cumbersome to implement as the sensor size is increased. It has thus far had limited use for an SDD type of detector. The relative unpopularity of this type of mount can be largely attributed to the difficulty in installing a large-area sensor or sensor module in a non-axial orientation within the conventional tube-type mount.

Summary of Conventional X-Ray Detector Art

It will be seen from the above discussion of prior art that a number of imaginative approaches have been applied to the challenge of configuring EDX detectors in order to optimize performance. The introduction of SDD technology has provided a new variable in terms of larger-area sensors and multiple-sensor units. However, through the 40 years of EDX development, and continuing through the present, there are certain things that have not varied at all. These include:
 1. The "sensor on a stick" format whereby the sensor is mounted at the end of a straight rod or tube that extends into the specimen chamber.
 2. The modular port-mounted arrangement, whereby the detector is a discrete entity from the microscope and is supported within the specimen chamber via attachment to an exterior port.

3. The cold finger approach in which the sensor is cooled via a copper bar, heat pipe, or similar thermally conductive rod that extends through the vacuum envelope of the microscope.
4. The external cold source approach in which a "sink", distinct from the microscope itself and operating at ambient or lower-than-ambient temperature, is incorporated in the detector body located external to the microscope's specimen chamber.
5. The external electronics approach, in which all operational electronics required to operate the detector (other than the sensor's associated FET) is located exterior to the vacuum chamber.
6. The modularity of the x-ray detector which implements each detector unit as a separate entity, distinct from the microscope and from other detectors that are also used in the electron microscope.

Many of the above conventions derived directly or indirectly from practical considerations associated with the requirement for an LN reservoir for cooling of the Si(Li) sensor—a constraint that is no longer relevant for SDD sensor technology. At the same time, the availability of the critical SDD sensor technology as packaged modules has made it more practical for an electron microscope manufacturer to utilize this technology in unconventional ways. However, long-standing conventions regarding x-ray detector and electron microscope configurations, as well as commercial factors related to the partition of the industry into detector manufacturers and microscope manufacturers have acted to inhibit innovations which would depart from long-accepted conventions. In this context, the present inventors have benefitted from the unique perspective accruing to decades of involvement in both x-ray detector development and electron microscope development and have been able to perceive unique opportunity in the integrative approach here disclosed.

SUMMARY OF THE INVENTION

The present invention teaches a new approach to the design of an electron microscope, in which one or more energy-dispersive sensors are integrated directly into the structure of the microscope, thereby realizing a number of important benefits. The methods taught are directly applicable to SDD technology, but are also applicable to other types of solid-state x-ray sensor (such as the PIN diode, or CCD devices) which do not require liquid nitrogen cooling. The essence of these innovations is to abandon the "sensor on a stick" configuration which characterizes past and present x-ray detectors of conventional tube-mount design. Rather, it is shown how the x-ray detector function may be advantageously integrated into the structure of the EM itself. It will also be shown how certain of the innovative design elements disclosed here may also be advantageously employed in the context of a port-mounted detector of novel design.

The type of electron microscope towards which the subject innovations are specifically directed is one of the SEM/EPMA type wherein the specimen stage is located exterior to and below the final focusing lens. However, certain beneficial aspects of the innovations herein taught may also be applicable to electron microscopes of other configurations.

The essence of the subject invention is to depart from the traditional "sensor on a stick" (tube mount) geometry of conventional x-ray detectors by incorporating the sensor element(s) directly into the specimen chamber of an electron microscope of the SEM/EPMA type. Thus, rather than being an independent module inserted from the exterior, the subject invention implements the x-ray detector as an internal component of the microscope itself. This new approach has several advantageous characteristics:

1. It permits more optimal placement of the sensor(s) relative to the specimen since the sensor need not be located at the end of a straight rod or tube inserted from a mounting surface exterior to the microscope.
2. It permits more optimal design of the microscope, since the geometry is not constrained by the need to provide a direct line between the desired location of the sensor and an external port.
3. By eliminating much of the spatial "overhead" associated with tube mounting, it permits the sensor element to be more closely positioned to the specimen, thereby allowing the benefits of a larger sensor to be achieved with a smaller and less costly one.
4. It more readily and economically supports a multiplicity of detectors since separate ports need not be provided for each, and certain capabilities (such as thermal circuits and electronic connections) can be shared.
5. It facilitates more flexible and optimal integration of x-ray detectors with other detector types (e.g., BSE detector).
6. It permits more efficient approaches to thermal management of TEC-cooled sensors to be employed.
7. It facilitates the location of critical amplification and support electronics in close proximity to the sensor(s) to minimize noise pickup and reduce lead capacitance.

The electron microscope of the present invention incorporates two primary features, one being the physical integration of the solid state x-ray detector and the second pertaining to the thermal management of the integrated x-ray detector. With reference to the first feature, the electron microscope of the present invention is comprised of a vacuum chamber for containing a specimen to be analyzed, an optics column, including an electron source and a final probe forming lens, for focusing electrons emitted from the electron source, and a specimen stage positioned in the vacuum chamber under the probe forming lens for holding the specimen. The electron microscope further includes an integrated x-ray detector which is positioned in the vacuum chamber, the x-ray detector including an x-ray sensitive solid-state sensor.

Structural support for positioning and supporting the detector, including the sensor, within the vacuum chamber is provided and the entirety of this support is positioned within the vacuum chamber. No part of the x-ray detector, other than as required for electrical operation thereof, is located exterior to the vacuum chamber.

Regarding the second feature of the present invention, pertaining to the thermal management of the x-ray detector, an electron microscope is provided in combination with at least one x-ray detector. The microscope includes a vacuum chamber containing a specimen stage for holding a specimen to be analyzed and also including at least one x-ray detector incorporating a solid state x-ray sensor, mounted within the vacuum chamber. The x-ray detector is integrated into the microscope whereby structural or mechanical support for the sensor includes at least one thermo-electric cooler element for cooling the x-ray sensor. All of the thermo-electric cooler elements are retained within the vacuum chamber, none of them being positioned exterior to the vacuum chamber, and the structural support itself provides a thermal conduit for the thermo-electrically cooled sensor(s), and the structural support is engaged with the housing structure of the microscope as a heat sink, either interior to or exterior of the vacuum chamber.

In one embodiment, the x-ray sensor and the entirety of the structural support for the x-ray sensor are contained within the vacuum chamber whereby the mechanical support is attached to the housing structure interior of the vacuum chamber as a heat sink. In another embodiment thereof, the structural support for the x-ray sensor may exit through a port in the vacuum chamber and the structural or mechanical support exteriorly engages the microscope housing as a heat sink.

This invention discloses a new type of EM design with integrated EDX detection capabilities. This is a non-obvious invention in that the provisions for supporting the x-ray sensor module(s), especially the thermal conduction requirement, must be integrated into the design of the EM itself, which has heretofore not been a concern of EM manufacturers nor anticipated by EDX system manufacturers.

The subject invention will be specifically described in terms of integration of commercially available SDD detectors pre-mounted in a circular housing such as a TO-X case. The invention is obviously also applicable to other kinds of compact X-ray detectors that can be adequately cooled by thermoelectric cooling means, or which may require no cooling whatsoever. This includes older types of modular detectors (such as PIN diodes, which are commonly employed in hand-held x-ray monitors), as well as future generations of chip-based x-ray detectors that may be developed. Further, although it is certainly a convenient starting point to utilize off-the-shelf packaged detector modules (of the type illustrated in FIG. 3) it is anticipated that there will be further advantages gained by developing custom packaging of the sensor elements that is more suitable for such use than the packaged modules currently available. The distinction between a packaged sensor and a "bare" sensor may further be blurred by the potential development of robust sensors that do not require a separate vacuum window to protect them. The integration into a SEM-type instrument of discrete sensor elements (rather than packaged modules) is thus anticipated as an obvious extension of the present invention.

A primary aspect of the subject invention is that it teaches how an EDX detector may be beneficially integrated into the structure of the EM, rather than being a removable port-entry device as has been prior practice. A distinguishing characteristic of several variants of this invention relative to prior art is that the EDX detector(s) so integrated cannot be regarded as unitary elements that are installed via a microscope's chamber ports(s). Another way of expressing this very significant aspect of the present invention is that no mechanical component of the EDX detector need penetrate the vacuum envelope of the microscope—only the passage of electrical connections must be provided for. Novel and improved manners of implementing such electrical connections are also taught.

A second key aspect of the present invention is that in order to accomplish the above integration, a novel method of thermal management is practiced whereby structures of the electron microscope itself are employed in the thermal circuit whereby the sensor is cooled, the term "circuit" being employed in the sense of a mechanism whereby heat is transported away from the sensor to a heat sinking mechanism.

A third aspect of the present invention is that it teaches a particularly efficient and economical manner of accommodating multiple sensors, resulting in novel configurations of sensors that have not heretofore been practiced as a single detector system.

A fourth aspect of the present invention is that certain innovations developed in support of the first three aspects also have application in the practice of a modular port-mounted detector of novel design.

BRIEF DESCRIPTION OF THE DRAWINGS

Other objects and advantages appear hereinafter in the following description and claims. The accompanying drawings show, for the purpose of exemplification, without limiting the scope of the present invention or the appended claims, certain practical embodiments of the present invention wherein:

DETAILED DESCRIPTION OF THE PREFERRED EMBODIMENTS

Several variations of the subject invention are now described in order to illustrate the salient features of the invention. The examples are chosen to illustrate how the key innovation—incorporation of the x-ray sensor into the structure of the microscope—facilitates a number of useful variations that can be achieved in conjunction with additional innovative elements. Not all of the innovative elements are employed in each of the illustrated examples.

Example 1

Basic Single-Sensor Detector

Figure 1:
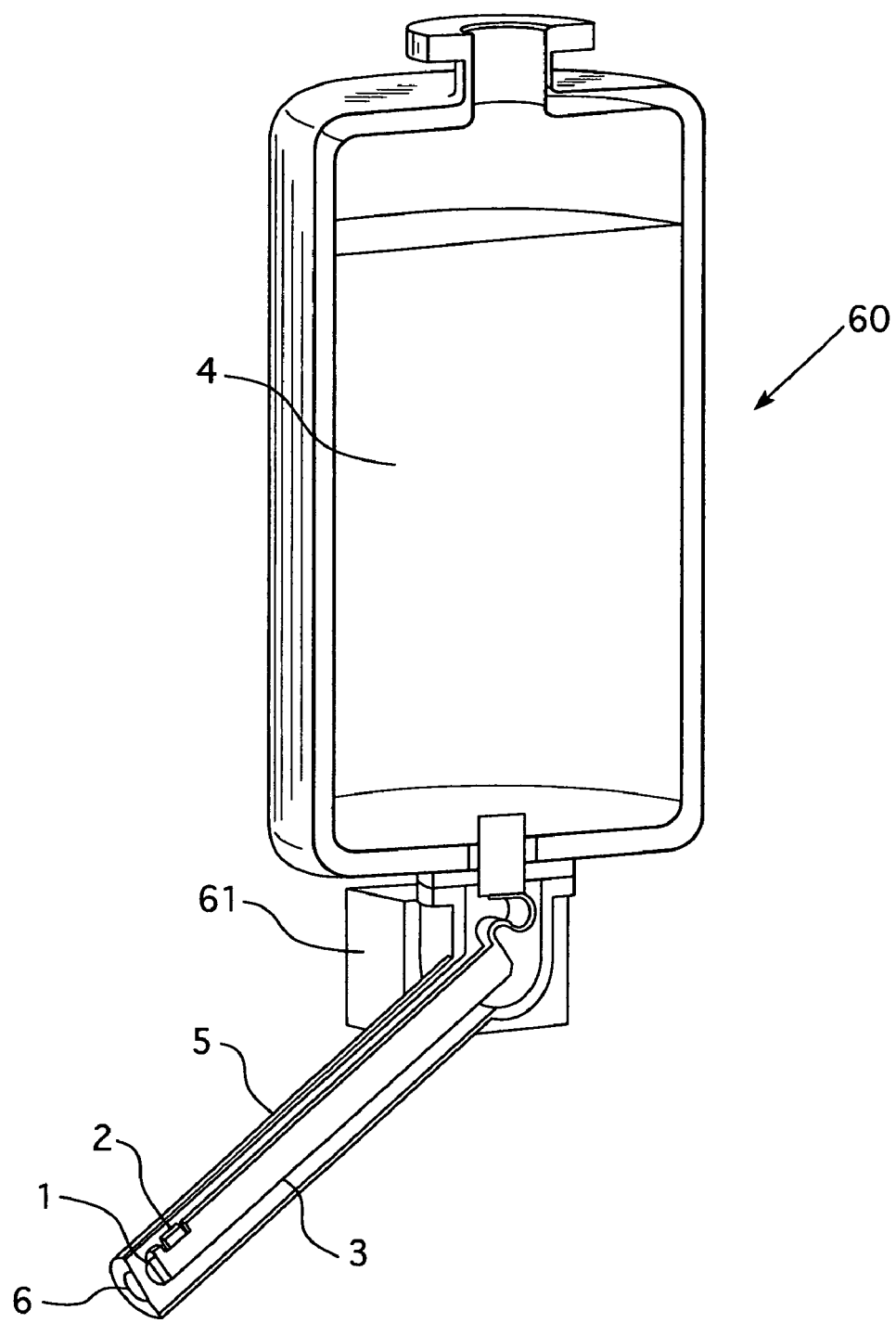
FIG. 1 is a perspective schematic representation in vertical cross section of a conventional Si (Li) EDX detector.
Figure 2:
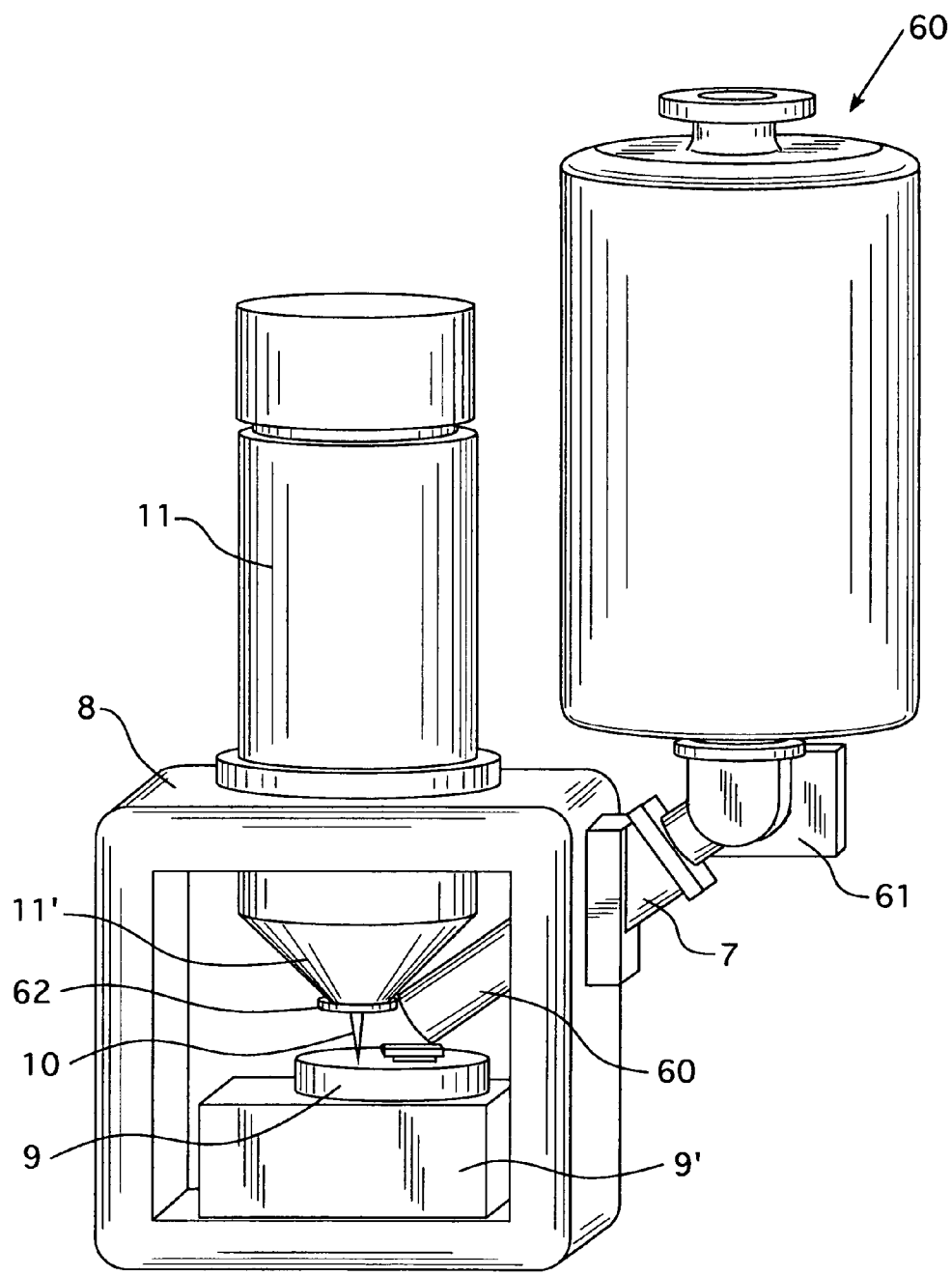
FIG. 2 is an isometric schematic illustration showing the manner in which a conventional Si(Li) EDX detector unit is installed on a conventional SEM or EPMA microscope.
Figure 3:
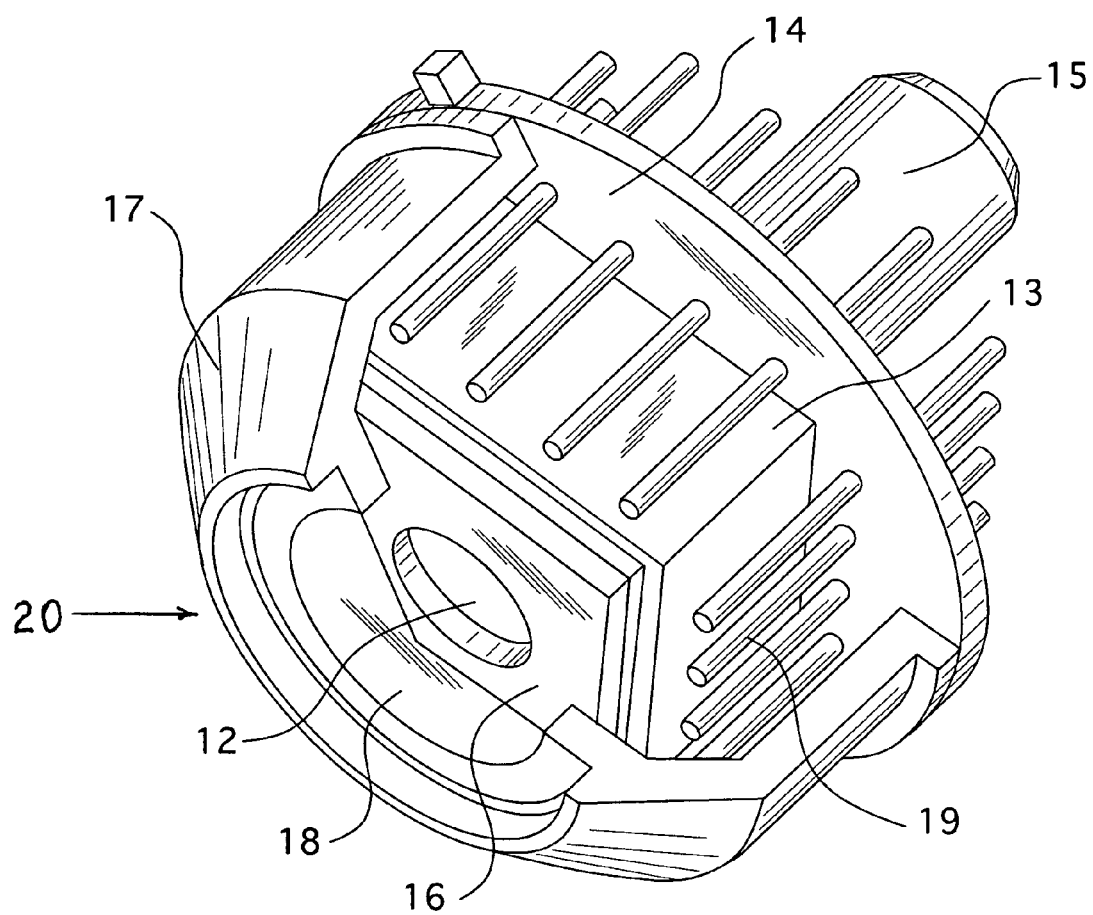
FIG. 3 is an isometric view in partial section of a packaged SDD module.
Figure 5:
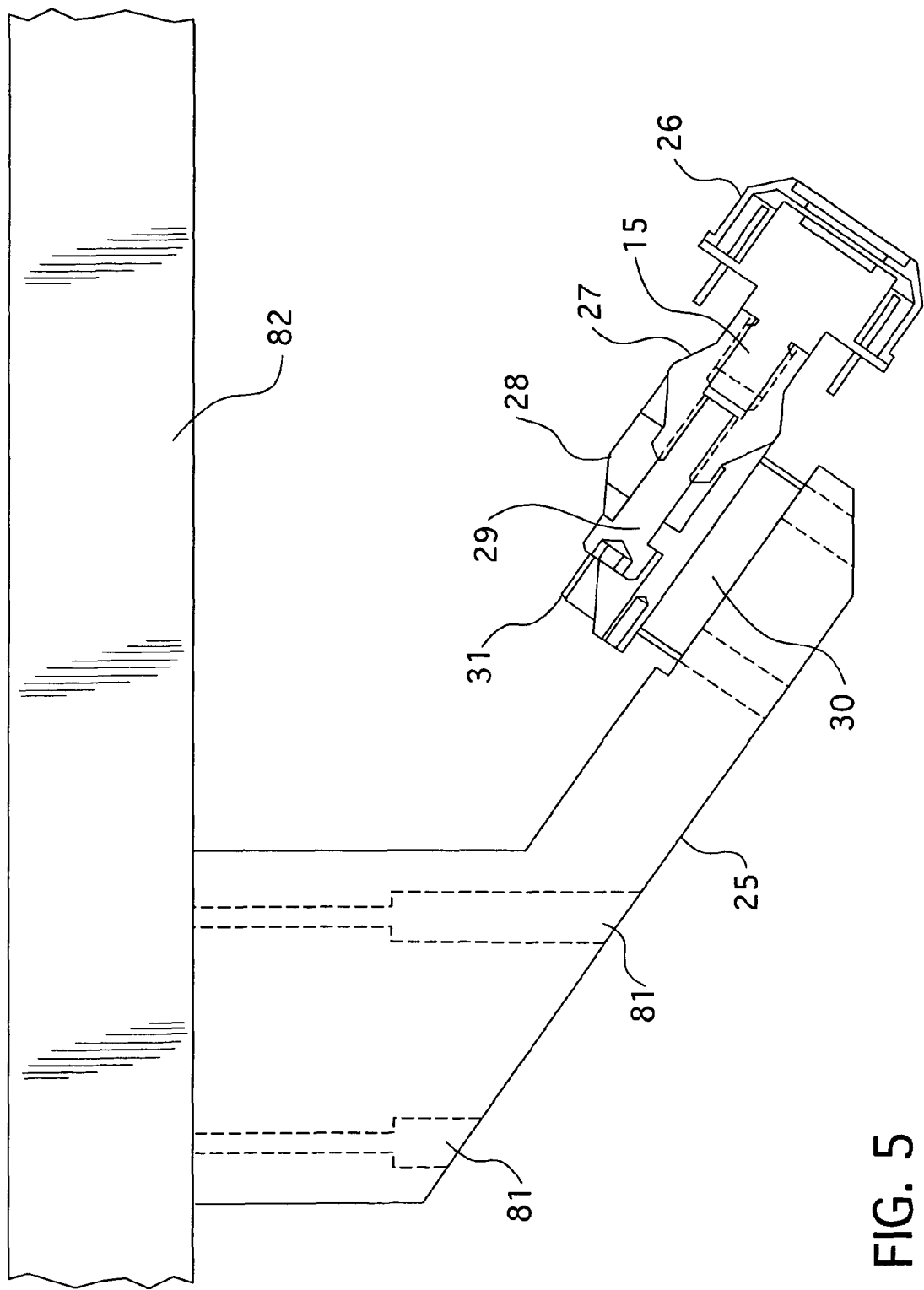
FIG. 5 is a side view in partial vertical section schematically illustrating the internal elements of an x-ray detector employing a packaged SDD module as incorporated in the microscope of the present invention.

FIG. 5 illustrates a very basic implementation of an integrated EDX detector constructed with a packaged SDD module. The mounting bracket [25] is designed to be attached to the flat "ceiling" surface of the specimen chamber [82] of a particular SEM by means of screw passage holes [81] provided. The detector element [26] is a packaged SDD module [20] of the type shown in FIG. 3. The dimensions of the mounting bracket [25] are chosen such that the SDD module [26] is held in the desired proximity to the specimen with its axis pointing at the nominal impingement point of the microscope's electron beam on the specimen. The threaded thermal stud [15] of the packaged SDD module [26] is screwed tightly into a tapped hole located in the front of the thermal interface stub [27] whose rear portion is tapered and provided with a central tapped hole. The role of the thermal interface stub is to provide an efficient thermal bridge between the packaged SDD module [26] and the cold plate [28]. The cold plate incorporates a mating tapered bore in its front face into which the tapered rear of the thermal stud is inserted. A screw [29]

inserted through the rear of the cold plate [28] pulls the thermal interface stub [27] into intimate contact with the cold plate, a good thermal contact being abetted by the conical tapers of the two parts. The cold plate [28] in turn clamps a TEC module [30] tightly to the front lip of the mounting bracket [25] by means of the four clamping screws [31].

The function of this arrangement is to efficiently extract heat from the detector module [26] and, by means of the TEC element [30], to transfer it to the mounting bracket [25], which in turn conducts it to the structure of the specimen chamber [82], where it is distributed through the substantial thermal mass of the specimen chamber and dissipated by convection from its surface and by conduction to associated structures. Since the amount of heat that is extracted from the packaged SDD module [26] is rather small, the additional heat generated by the thermoelectric circuit does not appreciably raise the temperature of the specimen chamber, and this can be minimized, if required, by making external provisions to facilitate convection and/or conduction of such excess heat from the microscope. Such provision may be as simple as providing structural elements, such as fins attached to the specimen chamber, that facilitate convective cooling. In the specific microscope for which this implementation was designed, an external forced-air source ensures a flow of ambient air over the specimen chamber, and this provision alone has thus far been found to be an adequate means of dissipating the minimal heat generated. In an extreme case, such as might be presented by an instrument intended for operation in an especially hot environment, a fluid-based heat exchanger or refrigeration device could be employed to cool the specimen chamber. The salient point is that such provisions for cooling of the specimen chamber of a microscope designed with this requirement in mind can be accomplished much more readily than the problem of dealing with the "spot cooling" of a conventional x-ray detector mounted on a conventional electron microscope.

Note that the specimen chamber of an electron microscope must necessarily be maintained under a relatively high vacuum while in operation and thus there is essentially no convective transfer of heat between any of its internal components. On the one hand, this is advantageous because it minimizes the parasitic transfer of heat to the cooled sensor device. However, the lack of air molecules to transfer heat across small gaps makes it essential that there is intimate mechanical contact between the various elements of the thermal circuit. Ensuring such contact is the purpose of the tapered interface between the thermal interface stub [27] and the cold plate [28]. It is also essential that the cold plate [28] and the mounting bracket [25] make good thermal contact with the opposing faces of the TEC module [30]. Techniques for providing a good thermal interface between surfaces are well known in the art. Careful preparation of the surfaces to ensure that they are free from surface irregularities is essential, but not sufficient. There exist a variety of thermal "grease" compounds as well as compressible thermal contact pads or deformable foils which are designed to be used between thermal elements to bridge any remaining gap irregularities. Of course, any such material must be selected carefully to ensure that it is compatible with vacuum usage.

The materials chosen for structures in the thermal path also play a role in the success of this scheme. In the preferred implementation illustrated, the thermal interface stub [27] and the cold plate [28] are fabricated from copper. The mounting bracket [25] is fabricated from aluminum. Both of these materials are notably good thermal conductors. On the other hand, the clamping screws [31] should not provide an efficient thermal path for transfer of heat across the TEC module. Stainless steel screws are an acceptable choice, due to the rather poor thermal conductivity of this material. Screws fabricated from a mechanically-strong low-outgassing plastic such as PEEK or Vespel are an even better choice, and PEEK screws are employed in the preferred implementation.

Figure 4:
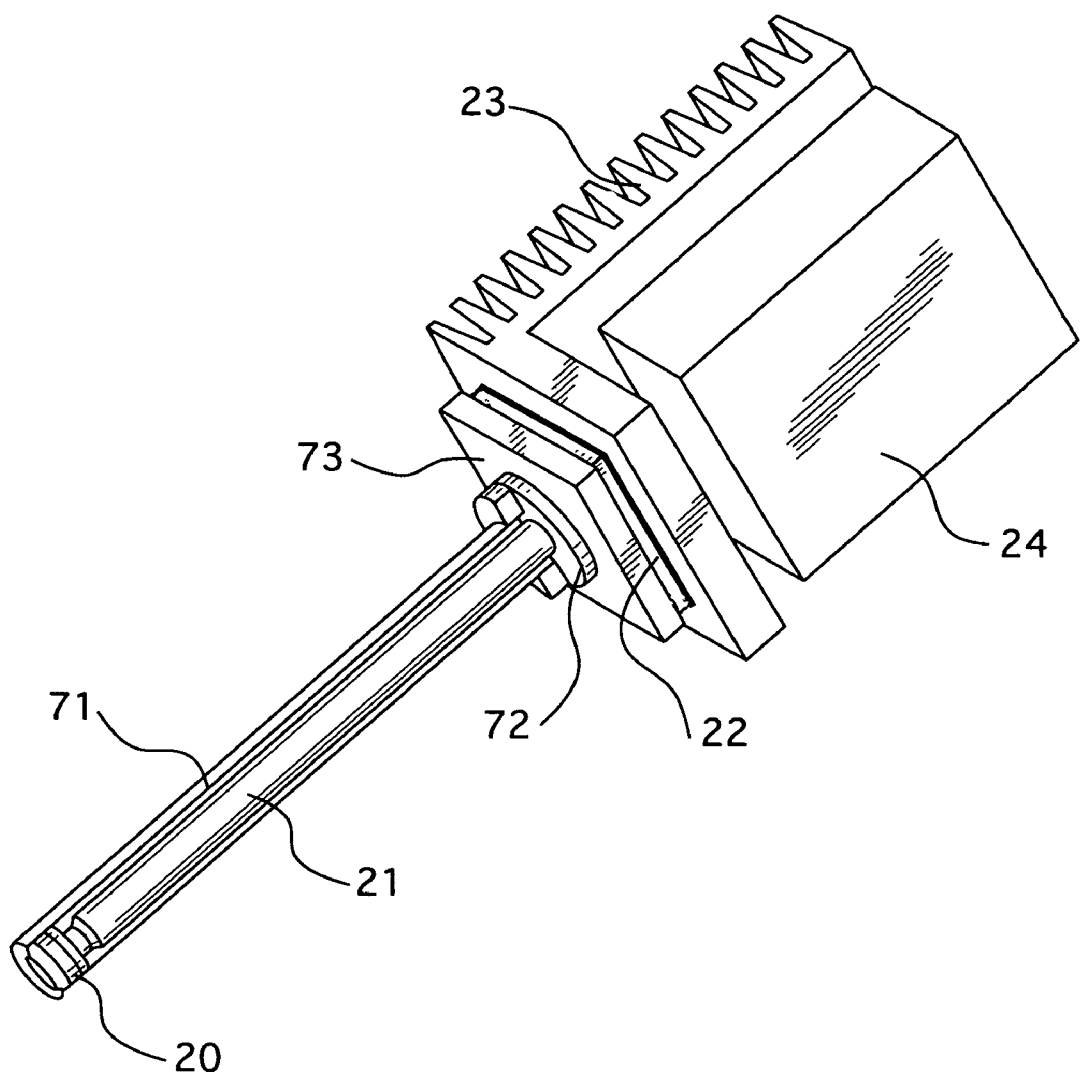
FIG. 4 is an isometric view in partial section illustrating internal elements of a conventional SDD detector employing a packaged SDD module.

In order for the SDD device to operate per specifications, its sensor element must be maintained at a temperature of approximately −20° C. Thus, it is necessary to provide a temperature reduction of approximately 45° C. between the ambient temperature of a typical laboratory environment (~25° C.) and the SDD sensor element. The TEC device [13] internal to the SDD module [20] could, in principle, provide this differential. However, the practical reality is that one cannot rely on the detector having access to this low an ambient temperature in order to sink the heat it generates. For example, one particular EM instrument designed for non-laboratory operation is specified for ambient operating temperatures as high as 35° C., and after making allowance for higher temperatures within the case of the instrument, the internal ambient temperature may be in excess of 40° C. It is well known that the efficiency of a TEC device declines rapidly with increasing temperature differential. For example, a specific TEC module driven by 0.6 amps of current provides 2.43 watts of cooling across an 18° C. temperature differential, and only 0.25 watts of cooling across a 60° C. differential. Thus, it is impractical for a single-stage TEC module to provide the large temperature differential that is required for an SDD detector to be operated for best performance in a warm environment. As illustrated in FIG. 4, the conventional approach is to employ a second TEC element [22], mounted exterior to the microscope, which removes heat from a long cold finger [21] that receives the heat from the SDD module [20], and which second TEC element [22] then transfers its heat to convective fins [23] incorporated in the case of the detector exterior to the microscope, whereby the heat is dissipated to the ambient air. However, this approach is not ideal in that: (1) the cold finger represents a substantial thermal mass that must be cooled to a suitable temperature on start up. Further, a certain amount of parasitic heat "leakage" to the cold finger by both radiation and conduction is inevitable by virtue of the fact that the cold finger is supported in close proximity to its tubular enclosure and that the cold finger must penetrate the specimen chamber of the microscope through some kind of vacuum seal. This parasitic heat transfer acts to increase the demands placed on the external TEC module, requiring it to dissipate a greater amount of heat. (2) A conventional detector design has few practical options for increasing the thermal dissipation from the hot side of its external TEC device. Electron microscopes have not generally been designed with any provision for thermal management of the detector environment and, due to the extreme vibration sensitivity of these instruments, the incorporation of fans within the EDX detector unit is strongly discouraged. Thus, the only practical option for ensuring adequate heat dissipation in warm environments is to incorporate extra-large fins on the external detector case to enhance passive convective cooling. Since the detector is often mounted in a very crowded area of the microscope, such large cooling fins are undesirable, and there is no certainty that they will receive adequate air flow in any case. By contrast, the simple design illustrated here minimizes these issues. There is a very minimal thermal mass interposed between the packaged SDD module [26] and the secondary TEC module [30], and there is little opportunity for parasitic heat transfer. Further, to the degree that the support bracket [25] is warmer than the specimen chamber [82], parasitic heat transfer actually aids the function of carrying heat away from the sensor. Consequently, there are some useful thermal efficiencies inherent to this type of design. It will also be readily apparent that it is a far simpler mechanical problem to provide a good thermal path to the specimen chamber than it is to provide an isolated path to an external sink while penetrating the specimen chamber wall. Lastly, it is to be noted that it is generally a simpler problem to dissipate an amount of heat from the rather substantial vacuum chamber of the electron microscope than it is to control the temperature in the specific locale of the detector. That is to say, by practicing thermal management as an issue associated with the microscope design, rather than just the concern of the detector manufacturer, more efficient and reliable thermal performance can be realized.

The only remaining aspect required to make this simple design into a functional detector is to provide the electrical connections needed to operate the unit. For this implementation, this is accomplished by means of a simple wiring harness (not shown in the figures). Miniature pin sockets are attached to the ends of the harness wires, which sockets are then pressed onto the pins [19] of the packaged SDD module [20] or [26]. The other end of the wiring harness is terminated by a multi-pin receptacle which mates to a vacuum-sealed electrical feedthru that passes through the wall of the specimen chamber (commercial sources of such feedthrus are known to those familiar with the construction of vacuum systems or they may be custom fabricated). On the exterior of the specimen chamber, the feedthru is connected to suitable detector electronics and to suitable controllers to operate and regulate the TEC modules (both the one [13] interior to the packaged SDD module and the secondary one [30] that sinks the heat from the packaged SDD module). These electronic components may be obtained from commercial suppliers or they may be custom-fabricated according to well-known principles.

It will be apparent that the extreme simplicity of the mechanical components of the detector here illustrated presents a striking contrast to the construction of a conventional SDD-based detector unit as illustrated in FIG. 4. Most notably, the elimination of the conventional cold finger and its precisely-manufactured vacuum-sealing cover represent a significant simplification. Further, it will be appreciated that the interior-mounted detector of the present example permits substantial simplification in the design of the EM itself since there is no need to provide an in-line port to allow a conventional detector tube to be inserted into close proximity to the specimen. Rather, the relatively small electrical feedthru that is required can be located on a convenient face of the specimen chamber. Thus, integrating the detector into the microscope's specimen chamber in this fashion affords great flexibility in design. However, it is also apparent that a detector of the type illustrated here is not a "generic" device which can be inserted into any electron microscope. Rather, for an optimal implementation, the detector and the microscope must be planned together. One of the important considerations is that of thermal conductivity of the microscope's specimen chamber. In the implementation illustrated here, the specimen chamber is constructed of aluminum, which provides an efficient thermal path to conduct heat from the detector's mounting bracket.

The specific means by which the detector is mounted into the microscope is, of course, open to many kinds of variation. The design here illustrated provides for connection to the "ceiling" surface of the specimen chamber, but it is a simple matter to adapt the support bracket [25] for mounting to any convenient surface that provides sufficient heat dissipation. There is, of course, nothing prohibiting the attachment of such a detector to a port cover of the microscope if that is the most convenient mounting point. If the port is sufficiently large, the cover may also house the electrical feedthru and its size may permit the detector to be inserted through the port in a manner similar to a conventional tube-mount design. This arrangement might be particularly advantageous in the case where the specimen chamber is constructed of a material which is not a good thermal conductor (e.g.: stainless steel). In such a case, the attachment to a copper or aluminum port plate (for example) fitted with external cooling fins could provide the necessary thermal dissipation means. But unlike the conventional tube-mount configuration, there is no need for the thermal path to physically penetrate the specimen chamber or be thermally isolated from it, and the port need not be located in a line-of-sight orientation relative to the specimen. Thus, port mounting of an x-ray detector constructed according to the present teaching is an option that may sometimes be used to advantage without departing from the spirit of the disclosed invention nor sacrificing its virtues.

It will also be apparent that, with appropriate design, the removal from the microscope for servicing of a detector constructed according to this disclosure can be made quite simple. In the present example, it involves removal of several screws and unplugging the electrical harness cable from the feedthru connection. Thus, although the design of the EDX detector is integrated into the structure of the electron microscope, it may still retain desirable modularity in terms of installation and servicing.

The simple detector illustrated here provides a low-cost yet effective means for providing EDX capability in an electron microscope such as a SEM or EPMA. However, the functionality of this design can be readily enhanced by simple modifications that will be apparent to one with ordinary skill. For example, it might be deemed desirable to enclose the detector in a simple housing for both cosmetic and protective reasons. Also, it is a simple matter to alter the design to accommodate different sizes or styles of x-ray sensor modules (including the incorporation of an electron trap for UTW types), or to alter the location and orientation of the SDD module to achieve desired variations in the geometry. It can further be noted that even this very simple detector design is conducive to the installation of multiple EDX detectors within a microscope, since multiple correctly-oriented ports need not be provided. And lastly, it can be noted that it would be a simple matter to migrate elements of the exterior electronic support circuitry into the specimen chamber within the context of this design (in the manner of the next example). In short, once the tyranny of the conventional line-of-sight, thermally-isolated, modular tube-mount x-ray detector convention is abandoned in favor of a design employing an internal second-stage TEC with a thermally-integrated support structure, many useful options and simplifications become available to the designer.

Example 2

A Column-Integrated Array Detector

The prior example illustrated the practical benefits that can be achieved with a very simple application of certain of the principles herein taught. This second example illustrates a more sophisticated implementation that incorporates additional novel practices and provides additional benefits.

Figure 6:
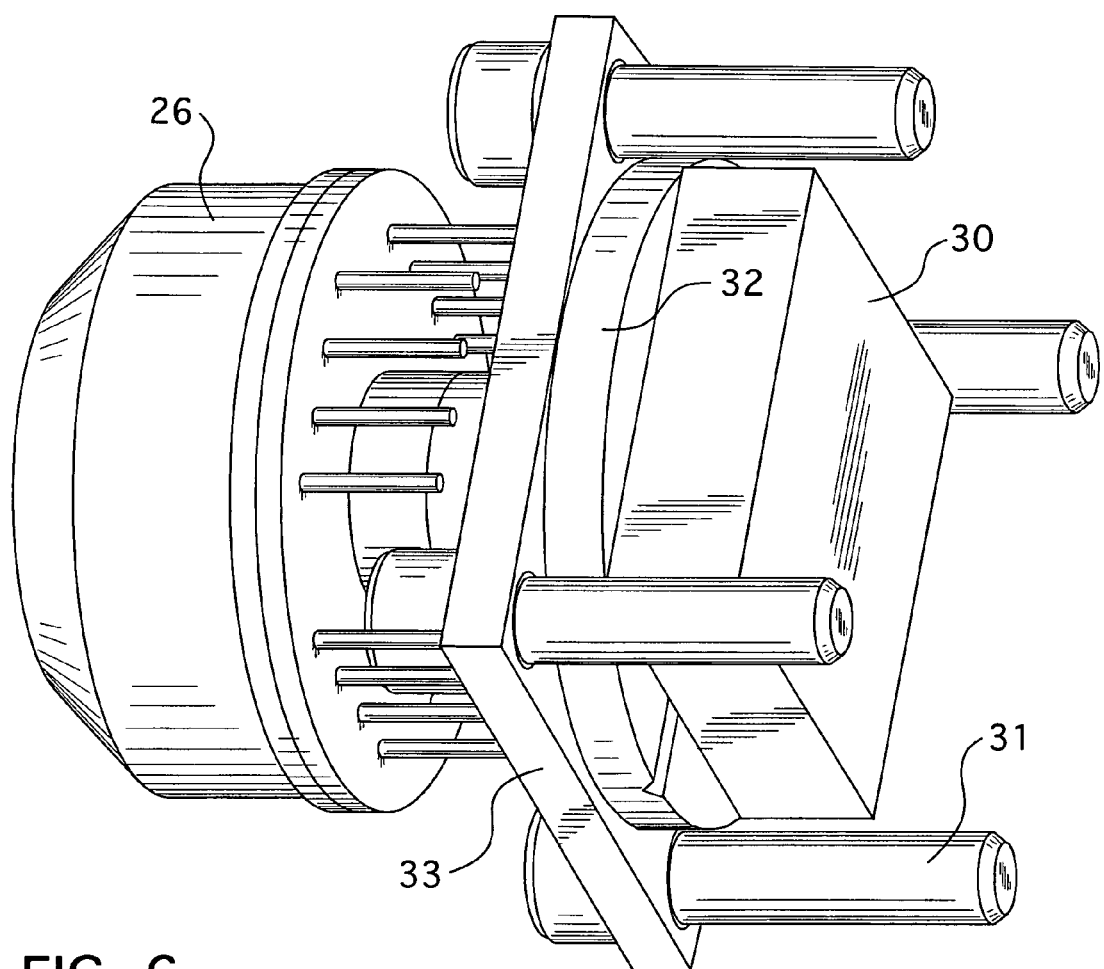
FIGS. 6 and 7 are perspective views illustrating implementation of an integrated EDX detector subassembly constructed with a packaged SDD module to be incorporated in the structure of the present invention.

It will have become apparent that an important key to accomplishing an efficient integration of a packaged SDD module into an electron microscope is in achieving a compact thermally-efficient coupling of the packaged SDD module to the secondary TEC module. FIG. 6 illustrates such a mounting. Here the thermal stud of the packaged SDD module [26] is screwed into a tapped hole in the stem of a "tee-shaped" copper stub [32] whose flat face is in contact with the cold face of the second TEC module [30]. A clamping plate [33] with a central opening is employed to clamp the warm face of the second TEC module [30] against a flat thermally-dissipative surface (not shown) by means of four clamping screws [31].

The subassembly depicted in FIG. 6 can be employed as the basic component of a variety of different detector configurations. It has the virtue of providing a very simple, yet rotationally-adjustable, coupling between the TEC module [30] and the packaged SDD module [26]. Not only does this coupling represent a very minimal thermal mass, but it also minimizes the number of thermal joints. A subtlety of this design is that the distance of insertion of the sensor can be customized by adjusting the length of the stem of the tee-shaped mounting stud [32] and the centering of the detector in the module can be adjusted by altering the location of the center hole in the thermal clamp plate [33]. Thus, this simple mount can be easily adapted for optimization of different detector sizes and configurations.

Figure 7:
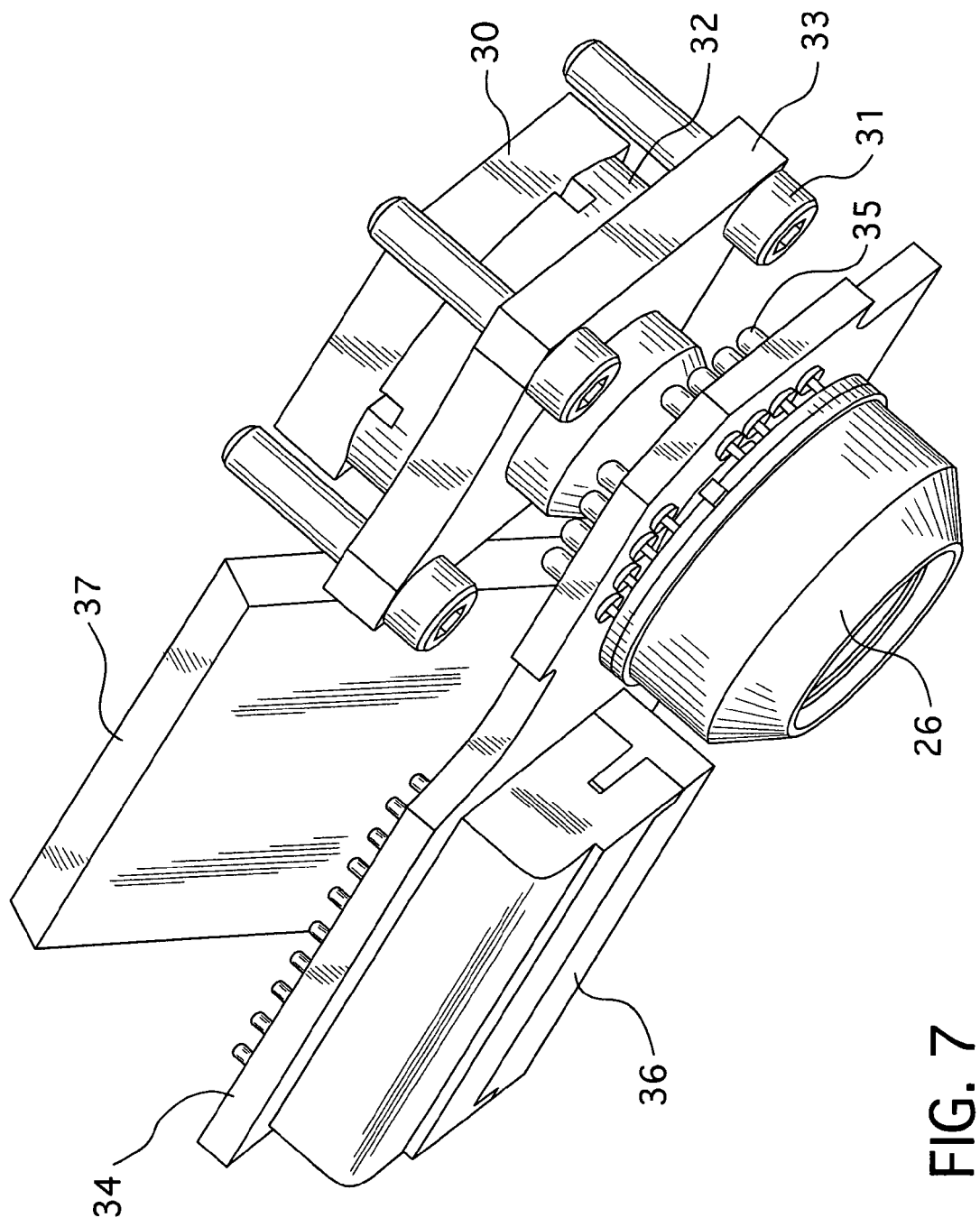

Rather than attaching wires to the pins from the packaged SDD module as was done in the prior example, FIG. 7 illustrates how this can be more conveniently achieved by means of a small printed circuit board [34] provided with pin sockets [35]. The circuit board may in turn be provided with a small connector [36] permitting attachment of a signal cable via a mating plug. Further, the circuit board provides a convenient place to install electronic circuitry in support of the packaged SDD module. In particular, it is advantageous to implement the first high-gain stage of the preamplifier and circuitry regulating the biasing of the sensor FET on this circuit board in order to minimize lead lengths and the opportunity for noise pickup. The packaged charge-sensitive amplifier device [37] shown in the figure is a commercially-available component representative of the kind of circuitry that may reside in proximity to the SDD module per this design. The choice of the particular circuitry chosen to reside on this board is an aspect of the art of preamplifier design which is independent of the teachings of the present invention, but it will be apparent to those skilled in the art that the opportunity to incorporate substantial circuitry in such close proximity to the SDD module, within the well-shielded environment of the microscope vacuum chamber, can be beneficial to the critical objective of a low-noise preamplifier design. It will also be apparent that implementation of such an advantageous arrangement is conventionally precluded by the requirement to fit the sensor into a tube of minimal diameter.

Figure 8:
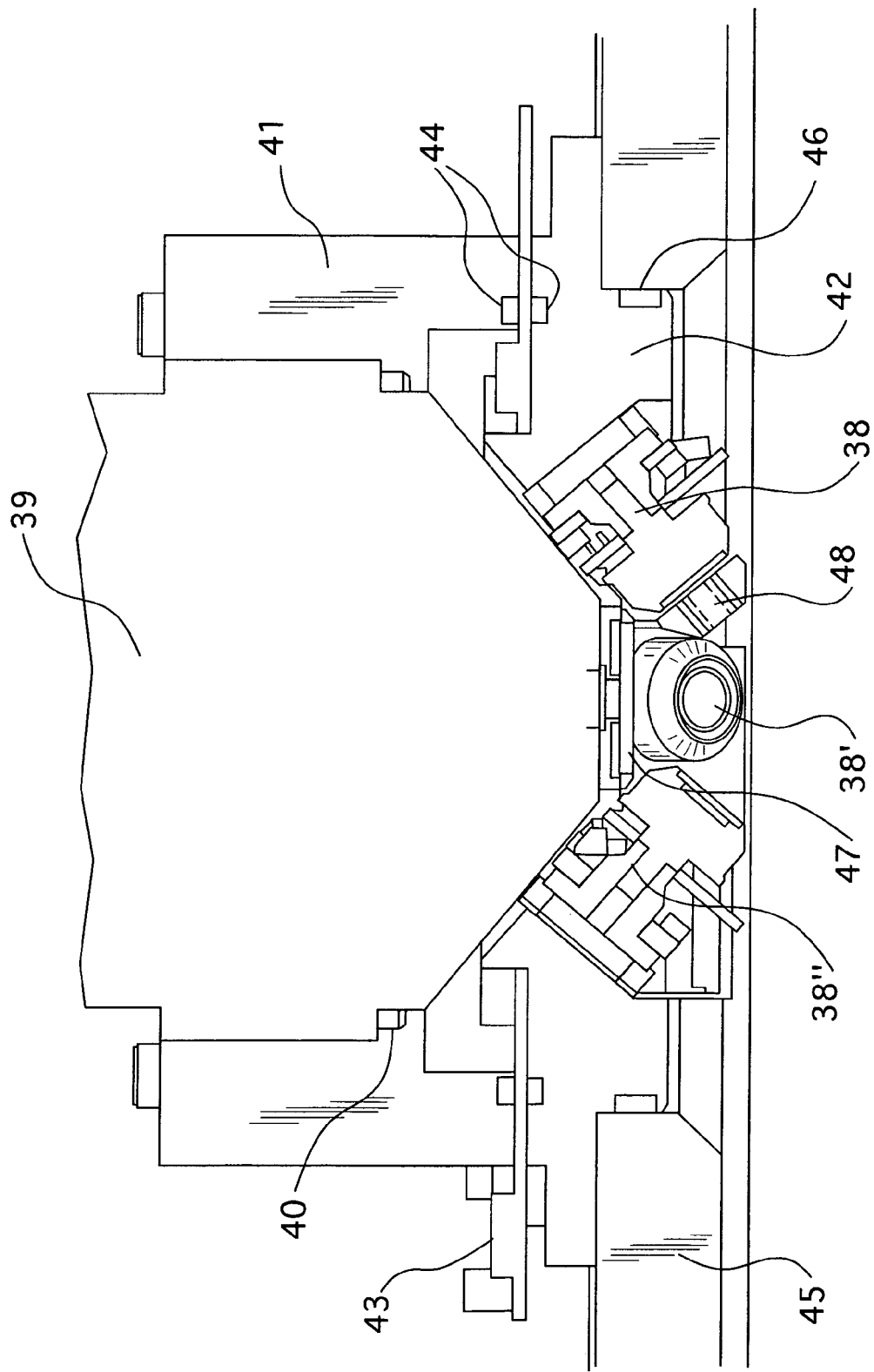
FIG. 8 is a schematic illustration in partial vertical cross section illustrating one embodiment of the present invention wherein an array of detectors of different types are incorporated into the electron microscope.
Figure 9:
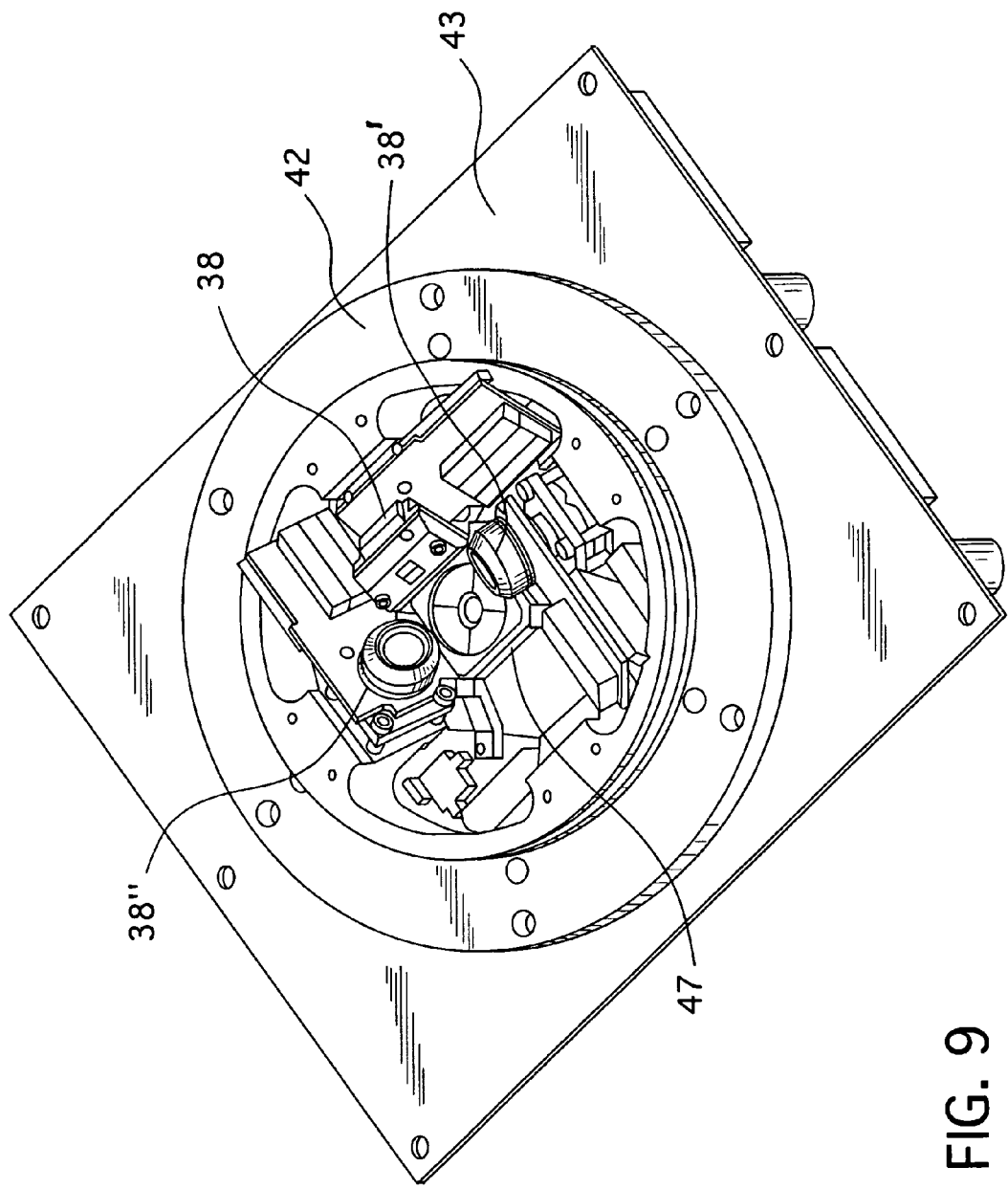
FIG. 9 is a bottom perspective view of the circuit board for the electron microscope of the present invention which provides a thermal barrier interposed between the electron column and the vacuum chamber.
Figure 10:
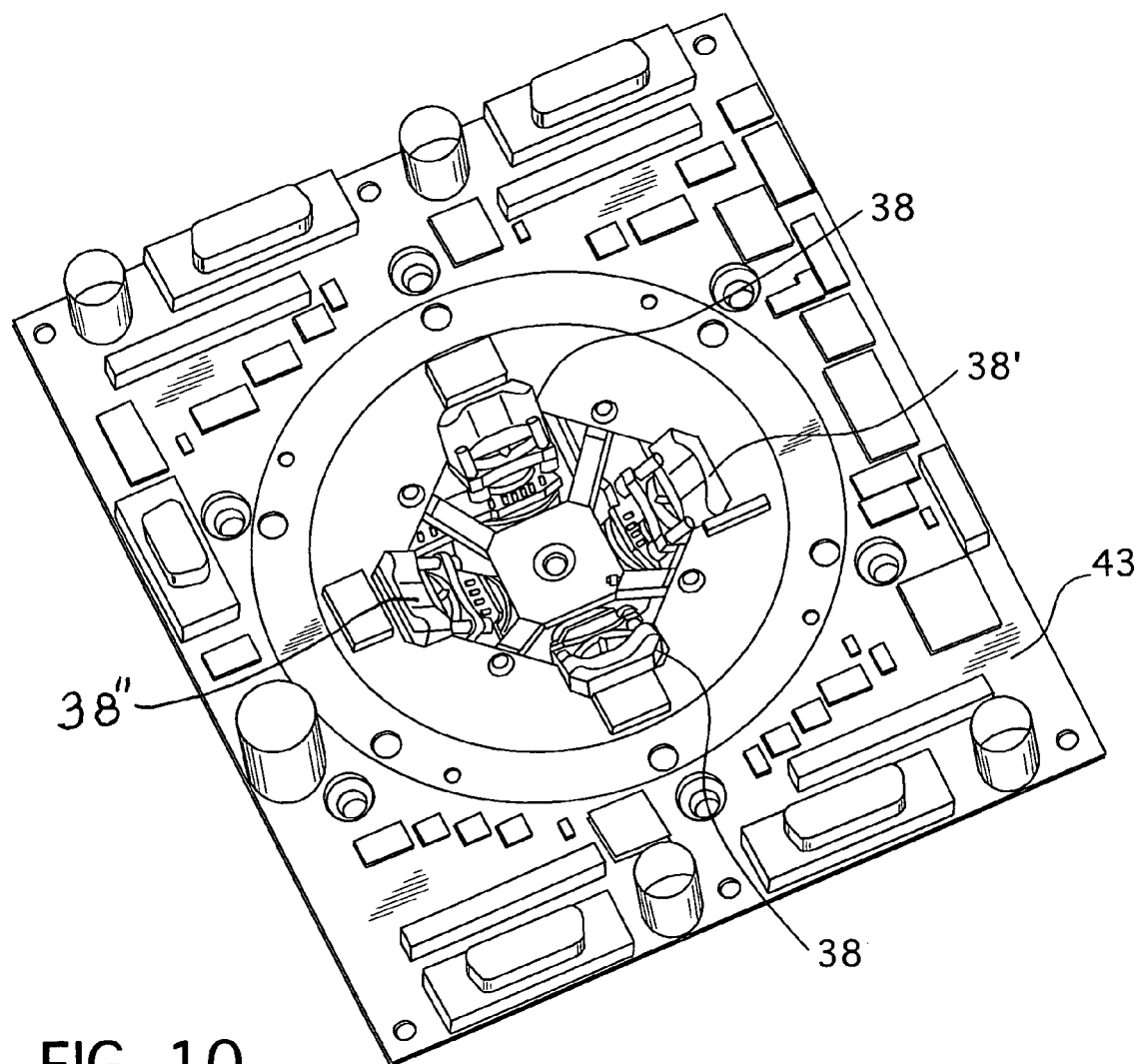
FIG. 10 is a top view of the circuit board shown in FIG. 9.

FIG. 8 illustrates the design of a column-integrated array detector that incorporates sub-assemblies [38, 38', 38"], three differently arranged in FIG. 9 and four in FIG. 10. The illustrated design permits up to four of these subassemblies to be closely arrayed about the focusing lens [39] of a particular SEM instrument designed for this purpose. The focusing lens [39] is sealed by means of o-ring [40] and secured to a column mounting flange [41], which is in turn removably attached to a detector mounting interface flange [42], which provides the appropriately-angled thermal mounting face for the TEC element [30] of multiple detector subassemblies [38, 38', 38"]. Sandwiched between the lens mounting flange [41] and the detector mounting interface flange [42] is a printed circuit board [43], that is sealed to said flanges by means of the pair of opposed co-radial o-rings [44] and said circuit board is also mechanically secured to the detector mounting interface flange [42] by means of screws (not shown). This circuit board [43] thus resides both interior to and external to the vacuum enclosure and serves a number of beneficial functions, as will be shortly explained. The detector mounting interface flange [42] is secured to the vacuum chamber [45] of the electron microscope by screws (not shown), with substantial thermal contact between said elements, and with vacuum sealing provided by an o-ring [46]. Also supported by and electrically connected to the circuit board [43] is an annular BSE detector [47] that resides immediately under the probe-forming lens [39]. One SDD detector subassembly [38] is fitted with an SDD sensor module of UTW type with 10 mm$^2$ active area and is equipped with an electron trap [48] constructed according to known principles of magnetic deflection. Detector subassembly [38'] incorporates a PIN diode type sensor, and detector subassembly [38"] incorporates a 30 mm$^2$ BeW type sensor module. Thus, this example illustrates the manner in which x-ray detectors of different configurations and types may be conveniently integrated into a common array, as well as other types of detectors, such as the BSE detector [47].

It will be observed that the detector array consisting of the detector mounting interface flange [42], the circuit board [43], the detector sub-assemblies [38, 38', 38"], the electron trap [48], and the BSE detector [47] constitute a modular assembly that can be demounted from both the column mounting flange [41] and the specimen chamber [45], as shown in FIGS. 9 and 10. It will be readily appreciated that such modular attachment is of great benefit for both manufacture and service of the detector array since all elements of the array can be installed and their alignment observed and adjusted separately from the remainder of the microscope.

The circuit board [43] serves a number of beneficial functions:
1. It provides a convenient means for interior electrical connections to the detectors constituting the array, employing the kinds of electrical connectors and wire harnesses commonly used with printed circuit boards.
2. It provides a convenient, compact, and economical means of transmitting electrical power and signals through the vacuum interface without relying on vacuum feedthrus, or requiring microscope ports for installation of said feedthrus.
3. It provides a thermal barrier between the column mounting flange [41] and the detector mounting interface flange [42]. Since magnetic focusing lenses [39] as are commonly employed in electron microscopes generate substantial amounts of heat, it is desirable to isolate this heat source from the detector mounting interface flange [42] and the specimen chamber [45] which together serve to dissipate the heat produced by the detector subassemblies [38, 38', 38"].
4. It provides the ready means for implementing support circuitry within the vacuum enclosure.
5. On the exterior of the microscope, it provides a convenient place to install additional circuitry and/or attachments to associated support electronics, employing conventional circuit board components.

It will thus be observed that the use of a common circuit board which spans both the interior and the exterior of the vacuum envelope, though not indispensable to the implementation of an integrated array detector as herein taught, is both a novel and particularly beneficial practice in its own right. Though the unusual physical arrangement of such a circuit board as a means of providing electrical connection between the internal and external elements of a vacuum system is previously known in vacuum system practice and has precedent in the context of electron microscope construction, it is not known to have been previously practiced in the context of electron microscope signal detectors as is taught here, nor is the thermal isolation aspect previously practiced. It will be easily appreciated that this novel arrangement for making electrical connections through the vacuum envelope would be impractical within the conventional art of modular tube-mounted EDX detectors. It will also be appreciated that the use of this arrangement would not be practical in the context of most conventional microscopes where the electron optics are not, as is the case here, designed to be readily demountable. Thus, despite the many benefits accruing, this novel practice would not be an obvious application of known art.

It will be apparent to those familiar with the art of vacuum systems that the materials used to construct the circuit board [43] as well as the small circuit boards [34] and the elements interiorly attached thereto must be compatible with the level of vacuum attained in the specimen chamber. For the levels of vacuum necessary for satisfactory operation of a relatively "low vacuum" instrument, this is satisfactorily accomplished using conventional materials. In the case of a "high vacuum" implementation, special circuit board materials are commercially available if needed.

It will be apparent that the array of detectors here illustrated can accommodate from one to four EDX detectors. Because of the intrinsically simple nature of this arrangement, as well as the ability to share common resources (such as power sources) this arrangement is substantially less costly than installing multiple EDX detectors of conventional modular tube-mount configuration. Since an array of suitable mounting ports in the microscope is not required, as would be the case for conventional port-mounted detectors, the microscope design is also simplified. Great flexibility also accrues to the fact that detector geometries can be readily altered by variations in the detector mounting interface flange [42] without altering the specimen chamber [45].

Another important area of novelty associated with the present example concerns the provision for integrating diverse detectors in a common array. Conventional practice is to treat each detector as a discrete unit, separate from other detectors and separate from the microscope. Multi-element-sensor detectors known in the prior art have utilized identical sensor elements. In addition to teaching the practice of integrating EDX detectors into the structure of the microscope, as has been illustrated here, the subject invention also teaches the practice of creating a subassembly of the microscope which incorporates multiple detectors of diverse types. This practice takes two significant forms:
1. The invention teaches the creation of an integrated detector array that can readily incorporate different varieties of solid-state x-ray sensors and thus be usefully configured to achieve specific analytical objectives where differing detector varieties are advantageous.
2. It will be appreciated by those with skill in the art that the concept of a demountable array onto which detectors can be installed greatly facilitates the incorporation into an electron microscope of many different detector types, in addition to x-ray sensors. The common mounting structure facilitates optimal location and adjustment, as compared to independent port-mounted devices, as has heretofore been the practice. This facilitates performance improvements through more optimal packing of the sensors as well as obvious economies in construction. Again, it will be noted that this desirable result has not been feasible in the context of conventional microscope design practice, and thus has not been heretofore pursued. Though the current example specifically teaches the incorporation of a back-scattered electron (BSE) detector into an array of EDX sensors of the SDD type, the utility of this innovation may productively be extended to the incorporation of other kinds of sensors and "analytical tools" such as Raman probes, cathodoluminescence detectors, secondary electron detectors, mechanical probes, and the like.

This example again illustrates the practices of thermal management taught by this invention. It will be noted that the detector mounting interface flange [42] is constructed of aluminum in the preferred implementation and is in substantial thermal contact with the remainder of the specimen chamber [45], such that the whole constitutes an effective means of dissipating heat generated by the TEC modules used to cool the detectors. This particular implementation is particularly efficient in that the detector mounting interface flange [42] functions as part of the vacuum envelope of the specimen chamber [45], and being thus exposed to ambient air, it serves the dual role of thermal transmission and thermal dissipation. The latter role might easily be enhanced, as desired, through incorporation of deliberately convective structures affixed to the exterior of this interface component.

Finally, it will be appreciated that though the examples here provided couple a single TEC element to each SDD sensor element, that this is not a requirement of the practices taught in the subject invention. Designs utilizing perhaps larger TEC modules that provide cooling for multiple sensors mounted on a common thermal substrate are also anticipated.

We claim:
1. An electron microscope comprising:
a vacuum chamber for containing a specimen to be analyzed;
an optics column, including an electron source and a final probe forming lens, for focusing electrons emitted from said electron source;
a specimen stage positioned in said vacuum chamber under said probe forming lens for holding the specimen;
an x-ray detector positioned within said vacuum chamber, said x-ray detector including an x-ray sensitive solid-state sensor and a mechanical support system for supporting and positioning said detector, including said sensor, within said vacuum chamber, wherein the entirety of said mechanical support system is contained within said vacuum chamber;
an electronic circuit board, wherein said electronic circuit board is sealed between two components of said vacuum chamber by means of seals applied to the opposite faces of said circuit board such that an area of the circuit board interior to said seals is within said vacuum chamber, and an area of the circuit board exterior to said seals is exterior to said vacuum chamber, said circuit board having conductors for carrying electrical signals between components of said x-ray detector located both exterior and interior to said vacuum chamber.

2. The electron microscope of claim 1 wherein no part of said x-ray detector, other than electrical components required for operation of said detector, is located exterior to said vacuum chamber.

3. The electron microscope of claim 1 wherein said vacuum chamber includes means interior of said vacuum chamber for attachment of said support system.

4. The electron microscope of claim 1 wherein said support system includes a portion of said vacuum chamber.

5. The electron microscope of claim 4 wherein said support system includes a structural interface between said optics column and said vacuum chamber.

6. The electron microscope of claim 1 including a FET associated with said solid-state x-ray sensor and additional circuitry to support operation of said solid-state sensor and associated FET, wherein said additional circuitry is contained within said vacuum chamber.

7. The electron microscope of claim 6 wherein said additional circuitry includes amplification circuitry for acting upon electrical output of said FET.

8. The electron microscope of claim 1 wherein said solid-state x-ray sensor is a silicon drift detector (SDD).

9. The electron microscope of claim 1 wherein a plurality of x-ray sensors are mounted within said vacuum chamber on said support system.

10. The electron microscope of claim 1 including an additional sensor, of a type other than a solid-state x-ray sensor, said additional sensor also attached within said vacuum chamber to said support system.

11. The electron microscope of claim 10 wherein said additional sensor is a backscattered electron detector.

12. The electron microscope of claim 1 including an additional sensor which is supported within said vacuum chamber, and wherein electrical signals associated with said additional sensor are also carried by conductors in said circuit board.

13. The electron microscope of claim 12 wherein said additional sensor is a backscattered electron detector.

14. The electron microscope of claim 1 including a thermal circuit for removing heat from said solid-state x-ray sensor.

15. The electron microscope of claim 14 wherein said vacuum chamber is incorporated in said thermal circuit.

16. The electron microscope of claim 15 wherein a thermal barrier is interposed between said optics column and said vacuum chamber.

17. The electron microscope of claim 16 wherein said thermal barrier is comprised of an electronic circuit board for carrying electrical signals associated with the operation of said x-ray detector.

18. The electron microscope of claim 17, including an additional sensor supported within said vacuum chamber, wherein electrical signals associated with said additional sensor are also carried by said circuit board.

19. The electron microscope of claim 15 wherein said x-ray sensor is a silicon drift detector (SDD) and said thermal circuit includes at least one thermoelectric cooling element.

20. A combination of:
  an electron microscope, said microscope including a vacuum chamber containing a specimen stage for holding a specimen to be analyzed;
  an x-ray detector, said x-ray detector including a solid state x-ray sensor mounted within said vacuum chamber;
  a thermal circuit engaged with said sensor and which incorporates at least one thermoelectric cooler element for purposes of removing heat from said sensor;
  a thermal insulating barrier thermally isolating said vacuum chamber from optical elements of said electron microscope, wherein said thermal insulating barrier is comprised of a circuit board retaining electronic circuitry for said x-ray detector.

21. The combination of claim 20, including a mechanical support for said x-ray detector including said x-ray sensor, wherein said support functions as an element of said thermal circuit for conducting heat to said vacuum chamber.

22. The combination of claim 21 wherein said mechanical support is entirely contained within said vacuum chamber.

23. The combination of claim 20, wherein said x-ray detector includes multiple x-ray sensors sharing said thermal circuit.

24. The combination of claim 20, said circuit board including conductors for carrying signals from said x-ray detector within said vacuum chamber to the exterior of said vacuum chamber.

25. The combination of claim 20, including a series of said thermoelectric cooler elements.

26. The combination of claim 20, wherein said solid state x-ray detector includes a SDD sensor.

* * * * *